(12) United States Patent
Korevaar et al.

(10) Patent No.: US 8,524,524 B2
(45) Date of Patent: Sep. 3, 2013

(54) METHODS FOR FORMING BACK CONTACT ELECTRODES FOR CADMIUM TELLURIDE PHOTOVOLTAIC CELLS

(75) Inventors: Bastiaan Arie Korevaar, Schenectady, NY (US); Juan Carlos Rojo, Niskayuna, NY (US); Roman Shuba, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 609 days.

(21) Appl. No.: 12/765,225

(22) Filed: Apr. 22, 2010

(65) Prior Publication Data
US 2011/0259423 A1 Oct. 27, 2011

(51) Int. Cl.
*H01L 21/00* (2006.01)

(52) U.S. Cl.
USPC ............ 438/98; 438/84; 438/95; 136/260; 136/264

(58) Field of Classification Search
USPC ............ 438/98, 84–86; 216/99; 136/260, 136/264
See application file for complete search history.

(56) References Cited

U.S. PATENT DOCUMENTS

| | | | |
|---|---|---|---|
| 4,456,630 A | | 6/1984 | Basol |
| 5,296,043 A * | | 3/1994 | Kawakami et al. .......... 136/244 |
| 5,557,146 A | | 9/1996 | Britt et al. |
| 5,688,366 A * | | 11/1997 | Ichinose et al. ............. 438/754 |
| 5,698,451 A * | | 12/1997 | Hanoka ........................ 438/98 |
| 5,726,065 A * | | 3/1998 | Szlufcik et al. .............. 438/57 |
| 5,894,853 A * | | 4/1999 | Fujisaki et al. .............. 134/26 |
| 6,137,048 A * | | 10/2000 | Wu et al. ..................... 136/260 |
| 6,169,246 B1 * | | 1/2001 | Wu et al. ..................... 136/265 |
| 6,384,317 B1 * | | 5/2002 | Kerschaver et al. ......... 136/256 |
| 6,388,187 B1 * | | 5/2002 | Takeyama et al. .......... 136/244 |
| 6,524,880 B2 * | | 2/2003 | Moon et al. ................. 438/57 |
| 7,196,018 B2 * | | 3/2007 | Szlufcik et al. ............. 438/745 |
| 7,741,225 B2 * | | 6/2010 | Rohatgi et al. ............. 438/700 |
| 7,824,563 B2 * | | 11/2010 | Stockum et al. ............ 216/83 |
| 7,837,890 B2 * | | 11/2010 | Stockum et al. ............ 216/89 |
| 7,842,596 B2 * | | 11/2010 | Rohatgi et al. ............. 438/610 |
| 7,884,375 B2 * | | 2/2011 | Park et al. ................... 257/80 |
| 7,888,168 B2 * | | 2/2011 | Weidman et al. ........... 438/98 |
| 7,939,363 B1 * | | 5/2011 | Johnson et al. ............. 438/87 |
| 7,972,894 B2 * | | 7/2011 | Veschetti et al. ........... 438/98 |
| 8,198,125 B2 * | | 6/2012 | Wang et al. ................. 438/96 |
| 8,253,010 B2 * | | 8/2012 | Liu et al. .................... 136/256 |
| 8,257,617 B2 * | | 9/2012 | Klein et al. ................. 252/513 |
| 2003/0160026 A1 * | | 8/2003 | Klein et al. ................. 216/83 |

(Continued)

OTHER PUBLICATIONS

Yan et al., Microstructure of CdTe thin films after mixed nitric and phosphoric acids etching and (HgTe, CuTe)-graphite pasting, Thin Solid Films, 472, 2005, pp. 291-296.*

(Continued)

*Primary Examiner* — David Vu
*Assistant Examiner* — Earl Taylor
(74) *Attorney, Agent, or Firm* — Penny A. Clarke

(57) ABSTRACT

A method for forming a back contact for a photovoltaic cell that includes at least one semiconductor layer is provided. The method includes applying a continuous film of a chemically active material on a surface of the semiconductor layer and activating the chemically active material such that the activated material etches the surface of the semiconductor layer. The method further includes removing the continuous film of the activated material from the photovoltaic cell and depositing a metal contact layer on the etched surface of the semiconductor layer.

19 Claims, 4 Drawing Sheets

(56) References Cited

U.S. PATENT DOCUMENTS

| | | | |
|---|---|---|---|
| 2004/0063326 A1* | 4/2004 | Szlufcik et al. | 438/695 |
| 2004/0144420 A1* | 7/2004 | Takeyama et al. | 136/256 |
| 2005/0247674 A1* | 11/2005 | Kubelbeck et al. | 216/92 |
| 2008/0121621 A1* | 5/2008 | Stockum et al. | 216/97 |
| 2008/0217576 A1* | 9/2008 | Stockum et al. | 252/79.2 |
| 2009/0142880 A1* | 6/2009 | Weidman et al. | 438/98 |
| 2009/0301557 A1* | 12/2009 | Agostinelli et al. | 136/256 |
| 2010/0015751 A1* | 1/2010 | Weidman et al. | 438/72 |
| 2010/0015756 A1* | 1/2010 | Weidman et al. | 438/96 |
| 2010/0068889 A1* | 3/2010 | Stockum et al. | 438/745 |
| 2010/0068890 A1* | 3/2010 | Stockum et al. | 438/754 |
| 2010/0224251 A1* | 9/2010 | Funakoshi | 136/261 |
| 2010/0233840 A1* | 9/2010 | Rohatgi et al. | 438/72 |
| 2010/0275987 A1* | 11/2010 | Sakamoto et al. | 136/256 |
| 2010/0300518 A1* | 12/2010 | Moslehi et al. | 136/255 |
| 2011/0041902 A1* | 2/2011 | Krokoszinski et al. | 136/255 |
| 2011/0108100 A1* | 5/2011 | Yu et al. | 136/255 |
| 2011/0114179 A1* | 5/2011 | Funakoshi | 136/259 |
| 2011/0117696 A1* | 5/2011 | Fisher | 438/102 |
| 2011/0143496 A1* | 6/2011 | Wang et al. | 438/96 |
| 2011/0253211 A1* | 10/2011 | Krokoszinski | 136/256 |
| 2011/0259423 A1* | 10/2011 | Korevaar et al. | 136/260 |
| 2011/0272013 A1* | 11/2011 | Moslehi | 136/255 |
| 2011/0315220 A1* | 12/2011 | Korevaar et al. | 136/258 |
| 2011/0318874 A1* | 12/2011 | Yamazaki | 438/98 |
| 2012/0024371 A1* | 2/2012 | Funakoshi | 136/256 |
| 2012/0040490 A1* | 2/2012 | Gallazzo et al. | 438/87 |
| 2012/0103261 A1* | 5/2012 | Johnson et al. | 118/726 |
| 2012/0222736 A1* | 9/2012 | Gee et al. | 136/256 |
| 2012/0266947 A1* | 10/2012 | Mueller et al. | 136/255 |
| 2012/0288987 A1* | 11/2012 | Radu et al. | 438/95 |

OTHER PUBLICATIONS

Batzner et al., A study of the back contacts on CdTe/CdS solar cells, Thin Solid Films, 361-362, 2000, pp. 463-467.*

A. Hanafusa et at., "Performance of Graphite Pastes Doped with Various Materials as Back Contact for CdS/CdTe Solar Cell," The Japan Society of Applied Physics, vol. 40, Part 1, No. 12, Dec. 2001, pp. 6764-6769.

* cited by examiner though the examples
METHODS FOR FORMING BACK CONTACT ELECTRODES FOR CADMIUM TELLURIDE PHOTOVOLTAIC CELLS

BACKGROUND

The invention relates generally to photovoltaic cells and, more particularly, to methods for forming back contact electrodes for photovoltaic cells.

Solar energy is abundant in many parts of the world year round. Thus, photovoltaic (PV) devices, which convert solar energy into electrical energy, have the potential to provide a reliable form of clean, renewable energy in many parts of the world. Typically, in its basic form, a PV (or solar) cell includes a semiconductor junction made of two or three layers that are disposed on a substrate layer, and two contacts (electrically conductive layers) for passing electrical energy in the form of electrical current to an external circuit. Moreover, additional layers are often employed to enhance the conversion efficiency of the PV device.

There are a variety of candidate material systems for PV cells, each of which has certain advantages and disadvantages. Cadmium telluride (CdTe) is a prominent polycrystalline thin-film material, with a nearly ideal bandgap of about 1.45-1.5 electron volts. CdTe also has a very high absorptivity, and films of CdTe can be manufactured using low-cost techniques. In theory, solar cell efficiencies in excess of twenty percent (20%) could be achieved for cadmium sulfide (CdS)/CdTe devices, provided various issues with the quality of the individual semiconductor layers and with the back contact electrode can be overcome.

Because of the high work function of CdTe, conventional metal back contacts are not generally viewed as being suitable. Instead, graphite pastes (either undoped or doped, for example with copper or mercury) are widely used as a back contact for CdTe PV cells. However, these graphite-paste back contacts tend to degrade significantly over time, as can be shown via accelerated lifetime testing. This degradation typically manifests itself as a decrease in fill factor (FF) and/or open circuit voltage $V_{OC}$ over time. The fill factor degradation is typically driven by a decrease in shunt resistance ($R_{sh}$) and an increase in the series resistance ($R_{OC}$) over time. The degradation of the back contact electrodes undesirably leads to degradation of the solar cell efficiency, on a long-term basis.

To date, the failure to develop low-resistance contacts has hindered the commercialization of CdTe solar cells. A cost-effective solution to this problem would remove one of the remaining hurdles for commercializing CdTe photovoltaic modules.

It would therefore be desirable to provide a back contact electrode for a CdTe PV cell, which exhibits less degradation over the lifetime of the PV cell. It would further be desirable to provide an economical method for forming the improved back contact electrode, in order to facilitate commercialization of CdTe PV cells.

BRIEF DESCRIPTION

One aspect of the present invention resides in a method for forming a back contact for a photovoltaic cell that includes at least one semiconductor layer. The method includes applying a continuous film of a chemically active material on a surface of the semiconductor layer and activating the chemically active material, such that the activated material etches the surface of the semiconductor layer. The method further includes removing the continuous film of the activated material from the photovoltaic cell and depositing a metal contact layer on the etched surface of the semiconductor layer.

Another aspect of the present invention resides in a method for forming a back contact for a photovoltaic cell that includes at least one cadmium telluride (CdTe) layer. The method includes applying a continuous film of a chemically active material on a surface of the CdTe layer and activating the chemically active material such that the surface of the CdTe layer is enriched with tellurium (Te). The method further includes removing the continuous film of the activated material from the photovoltaic cell and depositing a metal contact layer on the Te enriched surface of the CdTe layer.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As noted above, the high work function of CdTe leaves a relatively small set of metals that can be employed to form an ohmic contact with the CdTe layer. Suitable metals include platinum and gold, which are not commercially viable candidates for low-cost CdTe PV cells. However, lower cost metals, such as molybdenum, nickel, and chromium, typically form a tunneling barrier at the interface between the back contact and the CdTe layer. As CdTe typically has carrier densities between about $1 \times 10^{14}$ to about $1 \times 10^{15}$ per cubic centimeter, this tunneling barrier may be relatively large. Thus, absent proper treatment of the backside of the CdTe layer, the resistance with the back contact layer can be significant, thereby reducing the fill factor (and hence the efficiency) of the PV cell.

The present invention addresses these issues, and a method for forming an improved back contact 12 for a photovoltaic cell 10 is provided. The method is described with reference to FIGS. 1-8. As indicated, for example, in FIG. 3, the photovoltaic cell 10 includes at least one semiconductor layer 14. For the illustrated arrangements, the semiconductor layer 14 comprises cadmium telluride (CdTe). Although the examples provided are directed to CdTe, the invention can be used to form improved back contact electrodes for other semiconductors as well. Other example materials for semiconductor layer 14 include, without limitation, CdZnTe and ZnTe.

Figure 1:
FIG. 1 illustrates a first processing step for forming a back contact electrode.
Figure 5:
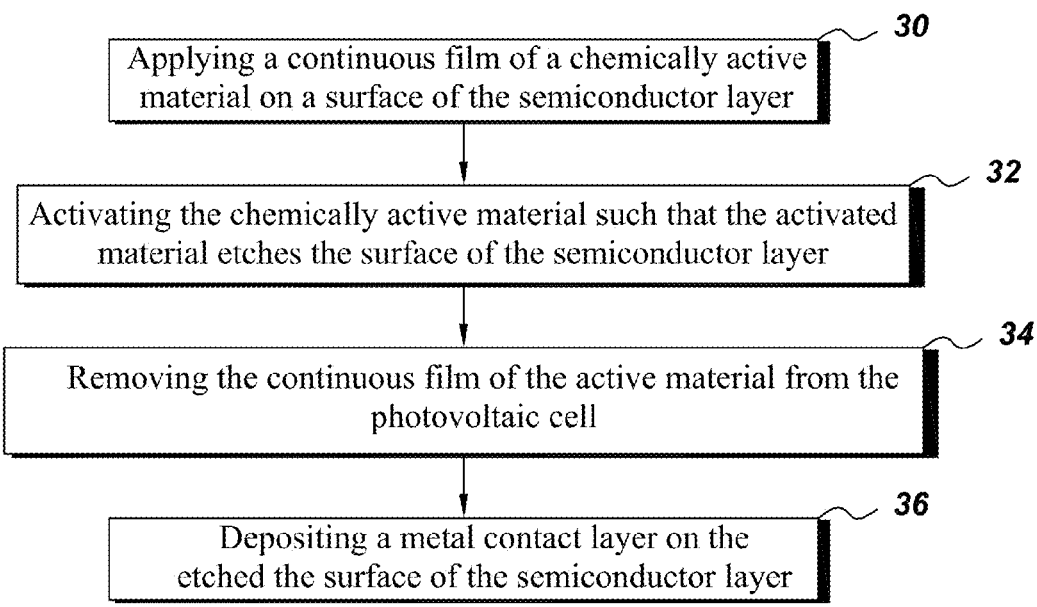
FIG. 5 illustrates an example method for forming a back contact for a photovoltaic cell.

As indicated, for example, in FIGS. 1 and 5, the method for forming a back contact for a photovoltaic cell includes, at step 30, applying a continuous film 16 of a chemically active material on a surface 15 of the semiconductor layer 14. For certain example arrangements, the continuous film 16 has a thickness, which is greater than or equal to 0.5 µm. For more particular examples, the thickness of the continuous film is in a range of about 1-10 µm, and more particularly of about 2-5 µm. The continuous film 16 may be deposited using a variety of techniques, non-limiting examples of which include printing, screen-printing, dipping and spray coating.

As indicated in FIG. 5, the method further includes, at step 32, activating the chemically active material, such that the activated material etches the surface 15 of the semiconductor layer 14. For particular examples, the chemically active material comprises a chemically active paste. As used here, the term "paste" should be understood to mean a plurality of particles suspended in a binder. Non-limiting examples of the chemically active paste include pastes containing high surface area solid particles, such as carbon, silica or alumina, dispersed therein and also optionally containing halogen atoms, such as in the form of hydrochloric acid, chloride salt or iodide salt or organic compounds typically used for ion exchange resins. Although chlorine and iodine are listed as non-limiting examples, the chemically active paste may contain other halogens.

For more particular examples, the chemically active paste comprises a plurality of particles selected from the group consisting of alumina, carbon, boron nitride, silica and combinations thereof and a binder, where the particles are suspended in the binder. Non-limiting examples of the binder include water and organic solvents, such as dimethyl esters of dicarboxylic acids. It will be recognized that a variety of binders may be used, and the invention is not limited to a specific binder.

For certain examples the chemically active material comprises a graphite paste. The graphite paste may be undoped or may be doped with elements from groups IB or IIB of the periodic table of elements and/or elements from group VIA, such as, but not limited to copper (Cu), mercury (Hg), gold (Au), silver (Ag), zinc (Zn), tellurium (Te), selenium (Se), and compounds and combinations thereof, such as Cu/Au- or Cu/HgTe, $Ag_2Te$, $Ag_3PO_4$, and $Ag_2MoO_4$, as well as antimony-(Sb), nickel-(Ni), bismuth-(Bi), and lead-(Pb) based compounds. For certain examples, copper may be introduced into the graphite paste in the form of a class IB-VIA or IIB-VIA or IB-IIB-VIA semiconductor compound, such as copper telluride, mercury telluride, or as a copper dopant in mercury telluride. Beneficially, the introduction of copper in the form of a class IB-VIA or IB-IIB-VIA semiconductor compound, instead of using elemental or free copper, may help to prevent the diffusion of copper into the semiconductor layer 14.

For particular embodiments, the activation step 32 for the continuous film 16 comprises annealing the photovoltaic cell. In one non-limiting example, the photovoltaic cell 10 may be annealed at a temperature in a range of about 100-300 degrees Celsius, for a period in a range of about 5-30 minutes. However, it will be recognized that the specific anneal temperatures and times will vary based on the thickness of the film 16 and on the composition of the chemically activated material. In addition, although thermal activation is the example means for activating a graphite paste, other materials may be activated by other means, such as light, and the present invention is not restricted to a specific activation means.

According to more particular embodiments, performing the step 32 of activating the chemically active material makes the surface 15 of the CdTe layer 14 tellurium (Te)-rich. For particular examples, the surface 15 of the CdTe layer 14 has a Te/Cd ratio greater than about two (2). According to a more particular embodiment, the ratio Te/Cd>3 at the surface (15) of the CdTe layer 14, and still more particularly, Te/Cd>5 at the surface 15 of the CdTe layer 14. The Te enrichment is the highest at the surface 15 and tapers off as one moves deeper inside the CdTe layer 14, such that Te/Cd=1 at a certain depth within the CdTe layer 14. The relative concentration of Te to Cd at the surface 15 of the CdTe layer 14 can be measured, for example using X-ray Photoelectron Spectroscopy (XPS) and to some extent using Time-Of-Flight Secondary Ion Mass Spectroscopy (TOF-SIMS).

Returning to FIG. 5, the method further includes, at step 34, removing the continuous film 16 of the activated material from the photovoltaic cell 10. For particular examples, performing the step 34 of removing the continuous film 16 of the activated material from the photovoltaic cell 10 comprises applying a solvent to the activated material and removing the activated material and the solvent from the photovoltaic cell 10. In one non-limiting example, the continuous film 16 comprises a graphite paste, and the solvent comprises dimethylformamide (DMF). Other example solvents include water, tetrahydrofuran (THF), and methylethylketone (MEK). However, the invention is not limited to the use of specific solvents, but rather the specific solvent selected will vary based upon the specific chemically active material being removed and based upon other requirements, such as environmental and cost considerations. For certain implementations, the activated material and solvent are removed using non-contact means, such as an air or liquid jet. However, in other implementations, contact means could also be used, for example the partially dissolved material could be scraped or wiped off. For other example configurations, the step of applying a solution is omitted, and the continuous film 16 is removed by physical means, for example using a laser. It should be recognized that these examples are merely illustrative, and the invention is not limited to a specific technique for removing the continuous film.

Figure 2:
FIG. 2 illustrates a subsequent processing step for forming a back contact electrode.
Figure 3:
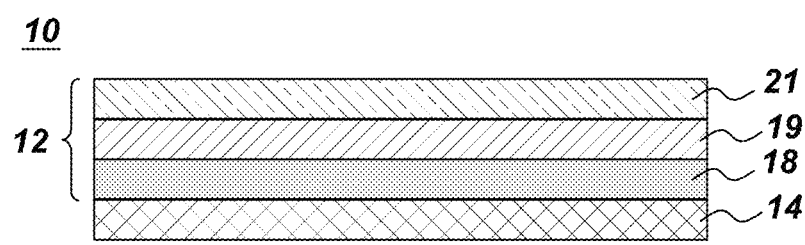
FIG. 3 illustrates an example back contact electrode structure.

As indicated, for example, in FIGS. 2 and 5, the method for forming a back contact for a photovoltaic cell further includes, at step 36, depositing a metal contact layer 18 on the etched surface 15 of the semiconductor layer. For particular configurations, the metal contact layer 18 comprises a metal selected from the group consisting of molybdenum, tantalum, tungsten, alloys of molybdenum, tantalum, titanium or tungsten, compounds comprising molybdenum or tungsten (e.g. molybdenumnitride), and combinations thereof. In one non-limiting example, the metal contact layer has a thickness of less than or equal to 100 nm. The metal contact layer 18 may be deposited using a variety of techniques, non-limiting examples of which include evaporation and sputtering. Moreover, one or more additional metal layers may be disposed on the metal contact layer 18 to form the back contact electrode 12. For example and as indicated in FIG. 3, an aluminum layer 19 with a thickness in a range of 50-1000 nm may be deposited on a molybdenum contact layer 18. For specific arrangements and as indicated in FIG. 3, a nickel layer 21 with a thickness in a range of 20-200 nm may be disposed on the aluminum layer 19. For this arrangement, the back contact electrode 12 comprises the molybdenum 18/aluminum 19/nickel 21 stack. In another example, the nickel-is replaced with chromium 21 with an example thickness range of 20-100 nm, such that the back contact electrode 12 comprises the molybdenum 18/aluminum 19/chromium stack 21.

Figure 4:
FIG. 4 illustrates a metal treatment step, where the metal may be deposited as a metal or as a metal-salt.
Figure 6:
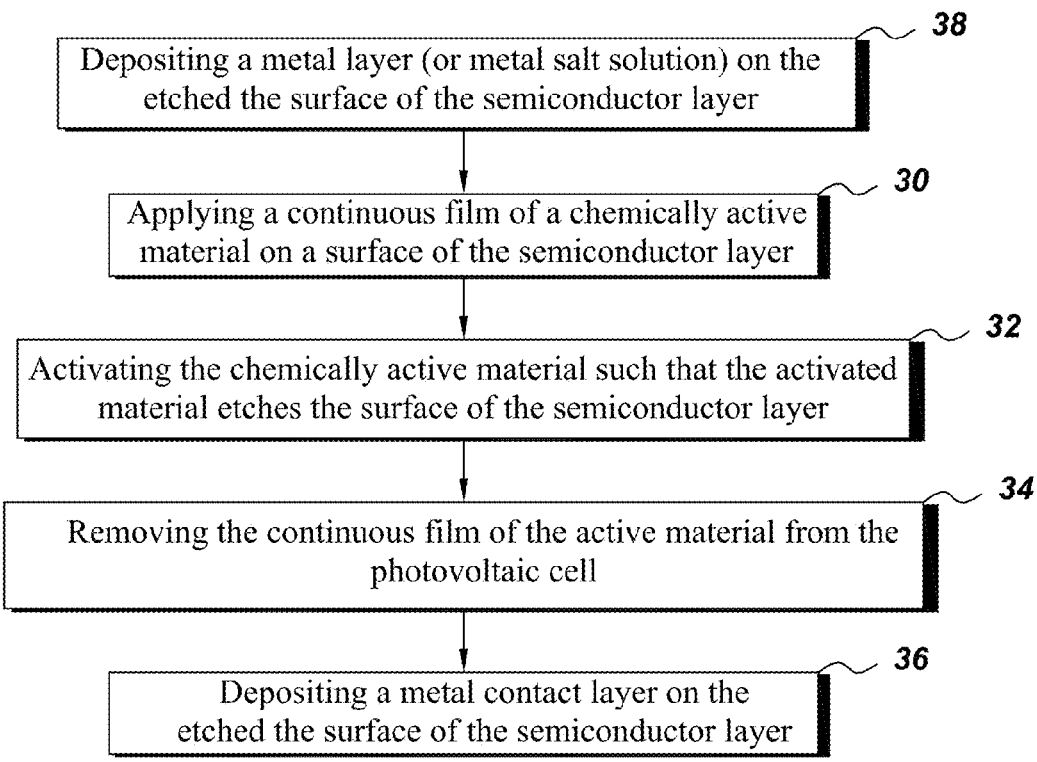
FIG. 6 illustrates an additional optional processing step for the method shown in FIG. 5.

In addition and as indicated in FIGS. 4 and 6, for example, the method of forming a back contact may optionally include, at step 38, depositing a metal layer 22 on the surface 15 of the semiconductor layer 14 prior to applying the continuous film 16. For this embodiment, at step 30 a continuous film of a chemically active material is deposited on the metal layer 22. Non-limiting examples of suitable materials for the metal layer 22 include copper, gold, silver, zinc and mercury. Example thickness for the metal layer 22 is in a range of about 0.1-10 nm. The metal layer 22 may be applied using a variety of techniques, non-limiting examples of which include evaporation and sputtering. In one non-limiting example, a very thin Cu-layer 22 is deposited at step 38 on the surface 15 by evaporation, and this process is typically referred to as a Cu-treatment step. Beneficially, 'intermixing' will then occur during the Te-enrichment step. Process steps 32, 34 and 36 are then performed, as indicated in FIG. 6. Although not shown in the illustrations, under certain processing conditions, some portion of the metal layer 22 may remain at the surface 15 of the semiconductor layer 14. However, the process parameters may be selected such that all of the metal reacts with the CdTe layer 14, such that none of the metal layer 22 remains at this interface.

FIGS. 4 and 6 also illustrate an example method for forming a back contact that optionally includes, at step 38, depositing a metal salt solution (also indicated by reference numeral 22 in FIG. 4) on the surface 15 of the semiconductor layer 14 prior to applying the continuous film 16. In one non-limiting example, a Cu-salt solution 22 is sprayed on the surface 15 of the semiconductor layer (14). Although 22 is depicted as a layer in FIG. 4, one skilled in the art will recognize that the metal-salt spray technique will not result in a continuous metal film. For this process, at step 30, a continuous film of a chemically active material is deposited after the Cu-salt solution 22 has been sprayed on the surface 15 of the semiconductor layer. Process steps 32, 34 and 36 are then performed, as indicated in FIG. 6.

Figure 7:
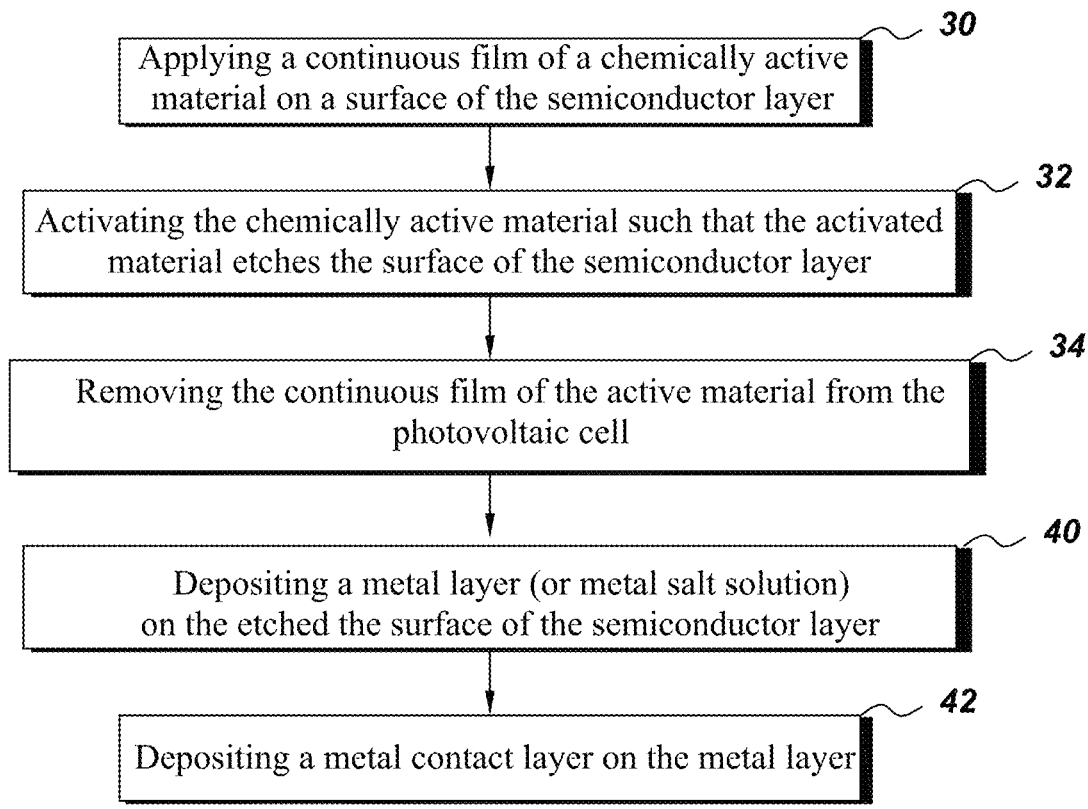
FIG. 7 illustrates an additional optional processing step for the method shown in FIG. 5.
Figure 8:
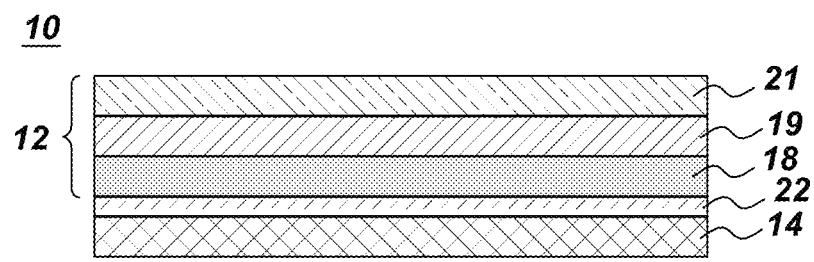
FIG. 8 illustrates another example back contact electrode structure.

FIGS. 4, 7 and 8 illustrate an example method for forming a back contact that optionally includes, at step 40, depositing a metal layer 22 on the surface 15 of the semiconductor layer 14 after the continuous film 16 has been removed (at step 34) and prior to applying the metal contact layer 18 (at step 42). For the resulting arrangement shown in FIG. 8, the back contact electrode 12 also includes optional metal layer 22. For particular configurations, the metal in layer 22 is selected from IB or IIB groups, such as Cu, Au, Ag, Hg, Zn or a combination thereof.

In addition to the optional process steps discussed above with reference to FIGS. 6 and 7, metal, such as copper, gold, silver, zinc and mercury, may be introduced by adding the respective metal particles, in either elemental or compound form, to the chemically active material prior to its application to the surface 15 of the semiconductor layer 14.

Beneficially, the above-described method provides back contact electrodes for CdTe PV cells, which exhibit less degradation over the lifetime of the PV cell, as demonstrated by the following example.

EXAMPLE

Figure 9:
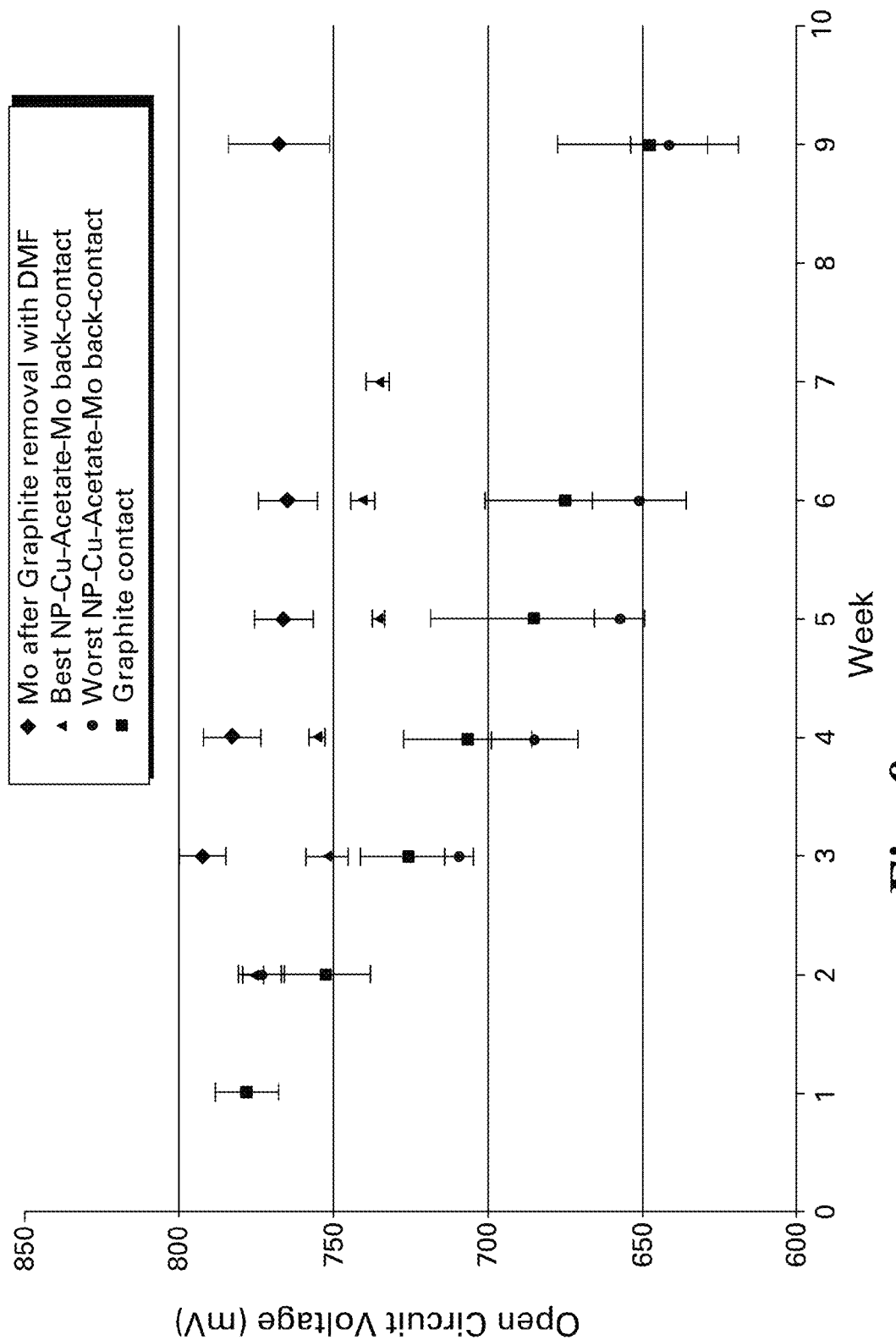
FIG. 9 is a graph showing the results of temperature accelerated lifetime measurements for different types of back contact electrodes.

FIG. 9 illustrates the performance of three types of back contact electrodes for CdTe PV cells that were subjected to temperature accelerated lifetime measurements. In particular, FIG. 9 shows temperature accelerated open circuit voltage ($V_{oc}$) measurements obtained for CdTe cells with three different types of back contact electrodes. After fabrication, the CdTe PV cells were placed in an accelerated lifetime ("ALT") tester, which exposed the devices to a continuous illumination level of 0.7 sun, at a temperature of 65 C, under open circuit conditions. Periodically, the devices were taken out of the ALT-tester, and their performance was measured under standard AM-1.5 conditions. FIG. 9 shows the resulting data, plotted as a function of the time that the devices were exposed in the ALT-tester.

Three processes were employed to fabricate back contact electrodes for CdTe PV cells. For all three processes, the molybdenum/aluminum back contact electrodes had a 100 nm thick Mo layer (layer 18), followed by 100-1000 nm of Al (layer 19).

In the first process, the back-contact of the CdTe was treated with $CdCl_2$ and then Te-enriched by exposure to a nitric-phosphoric (NP) etch for two minutes. Next, a copper-salt was sprayed onto the etched surface, and the resulting structure was baked. Next, Mo/Al back-contact metal layers were deposited.

In the second process, the CdTe was sprayed and baked with a Cu-salt and then covered with a graphite paste. A heat treatment was performed before the graphite was covered with the Mo/Al back-contact layers 18, 19.

A third set of molybdenum/aluminum back contacts were formed using the method of the present invention. First, a Cu-salt was sprayed onto a surface 15 of the CdTe layer 14, which was then baked. Next, a continuous film 16 of a graphite paste was formed on the surface 15 of the CdTe layer 14. The graphite paste was then activated and removed from the photovoltaic cell 10 using DMF. The Mo/Al contact layer 18, 19 was then deposited on the surface 15 of the semiconductor layer exposed by the graphite removal process. The molybdenum contacts were 100 nm thick followed by 100 nm of Al.

The three sets of PV cells were subjected to a continuous illumination level of 0.7 sun, at a temperature of 65 C, under open circuit conditions for a period of 9 weeks, and open circuit voltage measurements were performed weekly. As shown in FIG. 9, the Mo/Al back contacts formed using the method of the present invention exhibited significantly lower degradation during the accelerated lifetime testing than either the graphite contact electrodes or the Molybdenum back contact electrodes formed after the NP-type etch ("NP" in FIG. 9).

In addition, there was a wide range of performance for the NP electrodes, with the best NP back contact electrodes exhibiting performance superior to that of the graphite contact electrodes, and with the worst NP back contact electrodes degrading more rapidly than the graphite back contact electrodes, as shown in FIG. 9.

Although the cause of $V_{oc}$ degradation of CdTe solar cells is complex, one possible theory is that $V_{oc}$ degradation appears to be a function of Te-richness and Cu-content. For the 'loaded' graphite contacts, the significant degradation of $V_{oc}$ shown in FIG. 9 may be due to continuous interaction between etchants/impurities in the graphite and the rest of the solar cell (primarily interaction between the etchants/impurities in the graphite with the CdTe). By removing the chemically active film 16 prior to depositing the metal back contact, the present invention significantly reduces these interactions, thereby slowing the $V_{oc}$ degradation of the resulting CdTe cells. For the "NP" contacts, grain-boundary attack of the NP etchant appears to cause shunting paths in the device, negatively impacting the V. The present invention avoids this grain-boundary etching, because the paste does not penetrate into the grain-boundaries, as solutions, like NP, do. In addition, continuous exposure to the paste (as occurs for the graphite contacts) will eventually start etching the grain-boundaries, likely due to vapors forming in the spaces between the paste and the grain-boundaries.

A particular method for forming an improved back contact 12 for a photovoltaic cell 10 that includes at least one Cadmium Telluride (CdTe) layer 14 is described with reference to FIGS. 1-8. As shown for example in FIGS. 1 and 5, the method includes, at step 30, applying a continuous film 16 of a chemically active material on a surface 15 of the CdTe layer 14. The method further includes, at step 32, activating the chemically active material, such that the Tellurium (Te) is enriched on the surface 15 of the CdTe layer 14. The method further includes, at step 34, removing the continuous film 16 of the activated material from the photovoltaic cell 10 and, at step 36, depositing a metal contact layer 18 on the Te enriched surface 15 of the CdTe layer 14.

According to a particular embodiment, the surface of the CdTe layer 14 has a Te/Cadmium (Cd) ratio greater than about two (2). According to a more particular embodiment, Te/Cd>3 at the surface 15 of the CdTe layer 14, and still more particularly, Te/Cd>5 at the surface 15 of the CdTe layer 14.

According to a particular embodiment, the chemically active material comprises a plurality of particles selected from the group consisting of alumina, carbon, boron nitride, silica and combinations thereof and a binder, where the particles are suspended in the binder to form a chemically active paste.

According to a particular embodiment, the step 32 of activating the continuous film 16 comprises annealing the photovoltaic cell, and the metal contact layer 18 comprises a metal selected from the group consisting of molybdenum, tantalum, tungsten, alloys of molybdenum, tantalum and tungsten, compounds comprising molybdenum or tungsten (e.g. molybdenum nitride), and combinations thereof. For this particular embodiment, the step 34 of removing the continuous film 16 of the activated material from the photovoltaic cell 10 comprises applying a solvent to the activated material and removing the activated material and the solvent from the photovoltaic cell 10.

As shown for example in FIGS. 4 and 6, the method optionally includes, at step 38, depositing a metal layer 22 on the surface 15 of the CdTe layer 14 prior to applying the continuous film 16.

As shown for example in FIG. 7, the method optionally includes, at step 40, depositing a metal layer (or a metal salt solution) 22 on the surface 15 of the CdTe layer 14 after the continuous film 16 has been removed and prior to applying the metal contact layer 18. An example resulting back contact is shown in FIG. 8.

For particular embodiments, the photovoltaic cell 10 with a back contact 12 made using the above-described methods may have the following desirable properties. For certain configurations, a surface 15 of the CdTe layer 14 has a tellurium (Te)/cadmium (Cd) ratio greater than about two (2). According to a more particular embodiment, Te/Cd>3 at the surface 15 of the CdTe layer 14, and still more particularly, Te/Cd>5 at the surface 15 of the CdTe layer 14. For particular embodiments, the CdTe layer 14 is Te enriched only at the surface 15 and not along the grain-boundaries Beneficially, the resulting PV cells have back contact electrodes, which exhibit less degradation over the lifetime of the PV cell. By improving the stability of the back contact for the PV cells, higher outputs are achieved over the lifetime for the PV cells, as well as higher end of life-efficiency for the PV devices.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for forming a back contact for a photovoltaic cell that includes at least one semiconductor layer, the method comprising:
    applying a continuous film of a chemically active material on an entire surface of the semiconductor layer, wherein the semiconductor layer comprises cadmium telluride (CdTe);
    activating the chemically active material such that the activated material etches the surface of the semiconductor layer, wherein activating the chemically active material makes the surface of the CdTe layer tellurium (Te)-rich;
    removing the continuous film of the activated material from the photovoltaic cell; and
    depositing a metal contact layer on the etched surface of the semiconductor layer.

2. The method of claim 1, wherein the chemically active material comprises a chemically active paste.

3. The method of claim 2, wherein the chemically active paste comprises:
    a plurality of particles selected from the group consisting of alumina, carbon, boron nitride, silica and combinations thereof; and
    a binder, wherein the particles are suspended in the binder.

4. The method of claim 2, wherein the chemically active material comprises a carbon paste.

5. The method of claim 1, wherein activating the continuous film comprises annealing the photovoltaic cell.

6. The method of claim 1, wherein the continuous film has a thickness, which is greater than or equal to 0.5 μm.

7. The method of claim 1, wherein the metal contact layer comprises a metal selected from the group consisting of molybdenum, tantalum, tungsten, alloys of molybdenum, tantalum or tungsten, compounds comprising molybdenum or tungsten, and combinations thereof.

8. The method of claim 1, wherein the surface of the CdTe layer has a tellurium (Te)/cadmium (Cd) ratio greater than about two.

9. The method of claim 1, wherein performing the step of removing the continuous film of the activated material from the photovoltaic cell comprises:
    applying a solvent to the activated material; and
    removing the activated material and the solvent from the photovoltaic cell.

10. The method of claim 1, further comprising depositing a metal layer on the surface of the semiconductor layer prior to applying the continuous film.

11. The method of claim 1, further comprising depositing a metal salt solution on the surface of the semiconductor layer prior to applying the continuous film.

12. The method of claim 1, further comprising depositing a metal layer on the surface of the semiconductor layer after the continuous film has been removed and prior to applying the metal contact layer.

13. The method of claim 1, further comprising depositing a metal salt solution on the surface of the semiconductor layer after the continuous film has been removed and prior to applying the metal contact layer.

14. A method for forming a back contact for a photovoltaic cell that includes at least one cadmium telluride (CdTe) layer, the method comprising:
    applying a continuous film of a chemically active material on an entire surface of the CdTe layer;

activating the chemically active material such that the surface of the CdTe layer is enriched with tellurium (Te);

removing the continuous film of the activated material from the photovoltaic cell; and depositing a metal contact layer on the Te enriched surface of the CdTe layer.

15. The method of claim 14, wherein the surface of the CdTe layer has a tellurium (Te)/cadmium (Cd) ratio greater than about two.

16. The method of claim 14, wherein the chemically active material comprises:

a plurality of particles selected from the group consisting of alumina, carbon, boron nitride, silica and combinations thereof; and a binder, wherein the particles are suspended in the binder to form a chemically active paste.

17. The method of claim 14, wherein activating the continuous film comprises annealing the photovoltaic cell, wherein the metal contact layer comprises a metal selected from the group consisting of molybdenum, tantalum, tungsten, alloys of molybdenum, tantalum and tungsten, compounds comprising molybdenum or tungsten, and combinations thereof, and wherein performing the step of removing the continuous film of the activated material from the photovoltaic cell comprises:

applying a solvent to the activated material; and removing the activated material and the solvent from the photovoltaic cell.

18. The method of claim 14, further comprising depositing a metal layer or a metal salt solution on the surface of the CdTe layer prior to applying the continuous film.

19. The method of claim 14, further comprising depositing a metal layer or a metal salt solution on the surface of the CdTe layer after the continuous film has been removed and prior to applying the metal contact layer.

* * * * *